United States Patent
Zia et al.

(10) Patent No.: US 8,741,743 B2
(45) Date of Patent: Jun. 3, 2014

(54) INTEGRATED ASSIST FEATURES FOR EPITAXIAL GROWTH

(75) Inventors: Omar Zia, Austin, TX (US); Nigel Cave, Austin, TX (US); Venkat Kolagunta, Austin, TX (US); Ruiqi Tian, Austin, TX (US); Edward O. Travis, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 766 days.

(21) Appl. No.: 11/650,697

(22) Filed: Jan. 5, 2007

(65) Prior Publication Data
US 2008/0166859 A1    Jul. 10, 2008

(51) Int. Cl.
*H01L 21/20* (2006.01)
*H01L 21/762* (2006.01)

(52) U.S. Cl.
CPC ...... *H01L 21/7624* (2013.01); *H01L 21/76229* (2013.01); *H01L 21/76278* (2013.01); *H01L 21/76283* (2013.01)
USPC ........... 438/478; 438/150; 438/152; 438/481; 257/E21.562

(58) Field of Classification Search
USPC ........... 438/478, 150, 152, 481; 257/E21.562
See application file for complete search history.

(56) References Cited

U.S. PATENT DOCUMENTS

| | | | |
|---|---|---|---|
| 4,758,531 A * | 7/1988 | Beyer et al. | 438/429 |
| 5,278,105 A | 1/1994 | Eden et al. | |
| 5,994,199 A * | 11/1999 | Sugiyama | 438/404 |
| 6,093,631 A | 7/2000 | Jaso et al. | |
| 6,323,113 B1 | 11/2001 | Gabriel et al. | |
| 6,380,588 B1 * | 4/2002 | En et al. | 257/345 |
| 6,521,969 B1 * | 2/2003 | Tomita | 257/510 |
| 6,593,226 B2 | 7/2003 | Travis et al. | |
| 6,611,045 B2 | 8/2003 | Travis et al. | |
| 6,614,062 B2 | 9/2003 | Chheda et al. | |
| 6,727,567 B2 * | 4/2004 | Bastek et al. | 257/506 |
| 6,764,919 B2 | 7/2004 | Yu et al. | |
| 6,888,250 B2 * | 5/2005 | Mori et al. | 257/773 |
| 6,905,967 B1 | 6/2005 | Tian et al. | |
| 6,948,146 B2 | 9/2005 | Allen et al. | |
| 7,103,863 B2 | 9/2006 | Riepe et al. | |
| 2004/0256700 A1 * | 12/2004 | Doris et al. | 257/627 |
| 2005/0023648 A1 * | 2/2005 | Jung et al. | 257/620 |
| 2005/0097490 A1 | 5/2005 | Travis et al. | |
| 2005/0133832 A1 | 6/2005 | Murthy et al. | |

* cited by examiner

*Primary Examiner* — Michael Trinh
(74) *Attorney, Agent, or Firm* — Jackson Walker L.L.P.

(57) ABSTRACT

A method for making a semiconductor device is provided which comprises (a) creating a first mask for the epitaxial growth of features in a semiconductor device, said first mask defining a set of epitaxial tiles (219); (b) creating a second mask for defining the active region of the semiconductor device, said second mask defining a set of active tiles (229); and (c) using the first and second masks to create a semiconductor device.

19 Claims, 3 Drawing Sheets

INTEGRATED ASSIST FEATURES FOR EPITAXIAL GROWTH

FIELD OF THE DISCLOSURE

The present application relates generally to semiconductor fabrication processes and, more particularly, to semiconductor fabrication processes in which structural tiles are selectively incorporated into one or more layers of the device to improve process uniformity.

BACKGROUND OF THE DISCLOSURE

The characteristics of certain semiconductor fabrication processes are found to vary considerably from one device to another. For example, the rate and uniformity of chemical mechanical planarization (CMP) techniques employed in conjunction with shallow trench isolation (STI) processes varies considerably as a function of feature pattern density. As a result, the application of such trench CMP processes to substrates that contain active regions of different population densities can give rise to significant and undesirable non-uniformities in topography.

This problem is sometimes addressed through the incorporation of dummy features or "tiles" into less populated active regions of a semiconductor device so as to even out the pattern density between the two regions, thereby achieving greater process uniformity in the trench CMP process. Such dummy features or tiles are typically placed in the "white space" between active device features, and are thus independent of the circuit design of the semiconductor device.

The characteristics of epitaxial growth processes are also found to vary significantly with pattern density. For example, when epitaxial growth processes are used to form silicon germanium alloy films on CMOS substrates, the growth rate, quality, composition and thickness of the resulting films are all highly sensitive to pattern density.

Some attempts have been made in the art to compensate for the effect of pattern density on epitaxial growth. For example, in one known approach, a fraction of the dielectric tiles used to control topographical uniformity in the chemical mechanical polishing (CMP) attendant to shallow trench isolation (STI) are reused for density matching in subsequent epitaxial growth processes. However, this approach is found to produce suboptimal results in terms of compensating for differences in pattern densities during epitaxy.

There is thus a need in the art for a process which overcomes the aforementioned infirmities. In particular, there is a need in the art for a tiling scheme which addresses the needs of both trench CMP and epitaxy. These and other needs may be addressed with the methodologies and devices described herein.

DETAILED DESCRIPTION

Figure 1:
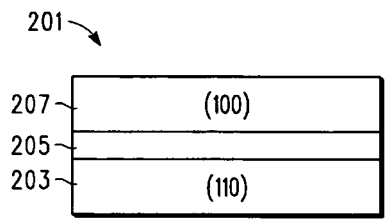
FIG. 1 is an illustration of a step of a process in accordance with the teachings herein.

In one aspect, a method for making a semiconductor device is provided. In accordance with the method, a first mask is created for the epitaxial growth of features in a semiconductor device, the first mask defining a set of epitaxial tiles. A second mask is created for defining the active region of the semiconductor device, the second mask defining a set of dielectric tiles. The first and second masks are then used to create a semiconductor device.

In another aspect, a method of forming a microelectronic structure is provided. In accordance with the method, a structure is provided which comprises a first semiconductor layer and which has a plurality of active areas and a plurality of non-active areas thereon. A first mask is used to epitaxially grow a plurality of epitaxial features on the structure. A second mask is used to form source and drain recesses in at least one of the active areas, and to form dummy recesses in the non-active areas. A semiconductor material is then selectively deposited in the dummy recesses and in at least one of the source and drain recesses.

In a further aspect, a method for making a semiconductor device is provided. In accordance with the method, a semiconductor structure is provided which comprises (a) a first semiconductor layer having a first crystallographic orientation, (b) a second semiconductor layer having a second crystallographic orientation distinct from said first crystallographic orientation, and (c) an electrically insulating layer disposed between said first and second semiconductor layers. A first plurality of trenches is created which extend through said second semiconductor layer and said insulating layer and which expose a portion of said first semiconductor layer, thereby defining a plurality of epitaxial tiles. The exposed portions of the first semiconductor layer are then epitaxially grown. A second plurality of trenches is then created which extend through the second semiconductor layer, and the second plurality of trenches are filled with a first dielectric material.

In yet another aspect, a semiconductor device is provided herein which comprises a set of epitaxial tiles optimized for epitaxial growth, and a set of dielectric tiles optimized for chemical mechanical polishing (CMP).

It has now been found that the aforementioned needs may be met through the provision of a tiling strategy which incorporates (a) a first tiling scheme or pattern which is optimized for chemical mechanical planarization (CMP), such as the trench CMP attendant to shallow trench isolation (STI), and (b) a second tiling scheme or pattern which is optimized for epitaxial growth. The particulars of each scheme may depend on whether trench isolation occurs before or after epitaxy.

Unlike approaches in which a fraction of the dielectric tiles used for trench CMP are reused for density matching in epitaxy, the approach described herein permits the needs of trench CMP to be decoupled from those of epitaxial growth processes. For example, such an approach allows the epitaxial tiles to be oriented so as to favor certain desired growth rates and facets, thereby allowing silicon overburden and epitaxial CMP characteristics to be tailored independently of the needs imposed by trench CMP. Consequently, this approach allows both global and local pattern density effects to be adequately compensated for.

The methodology disclosed herein may be further appreciated with respect to FIGS. 1-11, which disclose a first particular, non-limiting embodiment of a process in accordance with the teachings herein. With reference to FIG. 1, a structure 201 is provided which comprises a (110) substrate 203 upon which is disposed a buried oxide (BOX) layer 205 and an SOI layer 207, the later of which preferably comprises (100) silicon.

Figure 2:
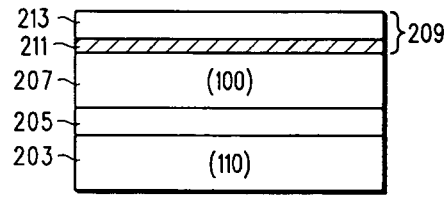
FIG. 2 is an illustration of a step of a process in accordance with the teachings herein.
Figure 3:
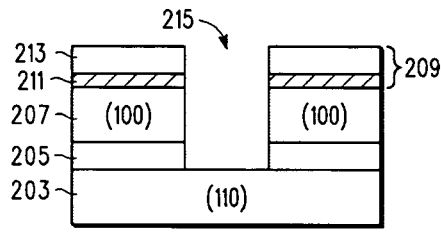
FIG. 3 is an illustration of a step of a process in accordance with the teachings herein.

As shown in FIG. 2, a hard mask 209 is then formed over the structure. The hard mask 209 comprises a layer of oxide 211 over which is deposited a layer of nitride 213. As shown in FIG. 3, the hard mask 209 is then patterned to expose a portion of the underlying SOI layer 207, and the exposed portion of the SOI layer 207 and the underlying BOX layer 205 are removed by etching to define a trench 215 therein which extends to the substrate 203. The trench 215 acts as a window to open up a feature, which may be, for example, an N-well. Hence, in some embodiments, wherever a PFET is located, such a window may be opened down to the substrate.

Figure 4:
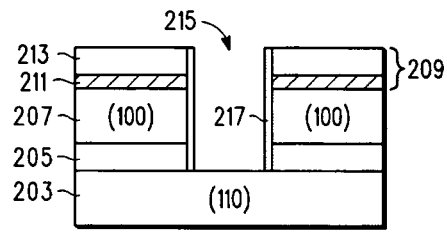
FIG. 4 is an illustration of a step of a process in accordance with the teachings herein.

As shown in FIG. 4, a sidewall spacer 217 is formed over the sidewalls of the trench and, in particular, over the exposed surface of the SOI silicon 207. The spacer preferably comprises a dielectric material, such as an oxide or nitride. In some embodiments, the sidewall spacer may be formed only over the exposed lateral surface of the SOI silicon layer 207. The sidewall spacer 217 is preferably formed by a deposition process, but may, in some embodiments, also be formed, in part or in whole, through thermal oxidation. In various embodiments, formation of the sidewall spacer 217 may involve the use of suitable masking and/or etching techniques.

Figure 5:
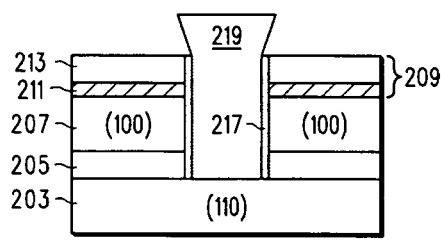
FIG. 5 is an illustration of a step of a process in accordance with the teachings herein.

The trench 215 is then filled with epitaxial material 219 through epitaxial growth of the (110) substrate 203, as shown in FIG. 5. The epitaxial material 219 is grown to a height above the masking layer 209. During the epitaxial growth process, the sidewall spacer 217 prevents lateral growth of the SOI silicon layer 207. In addition to ensuring the monocrystallinity of the resulting epitaxial growth, this also prevents the formation of stress fracture regions which might otherwise form along intersections of the crystal propagation fronts.

Figure 6:
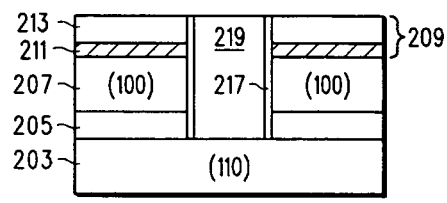
FIG. 6 is an illustration of a step of a process in accordance with the teachings herein.
Figure 7:
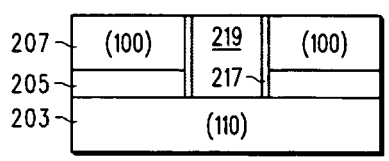
FIG. 7 is an illustration of a step of a process in accordance with the teachings herein.

Referring now to FIG. 6, the epitaxial material 219 is subjected to CMP to planarize it with respect to the hard mask 209. The hard mask 209 is then stripped, and the exposed epitaxial material 219 is removed through a suitable etching process so that it is essentially planar with respect to the SOI silicon layer 207 as shown in FIG. 7. Such an etching process may comprise wet and/or dry etching.

In the subsequent processing steps, the features formed by the epitaxial material 219 are used as dummy features or tiles in subsequent STI CMP processing to achieve process uniformity.

Figure 8:
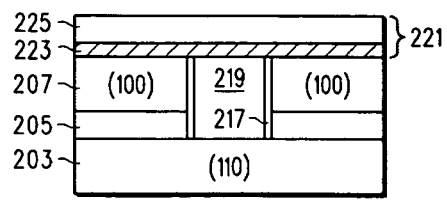
FIG. 8 is an illustration of a step of a process in accordance with the teachings herein.
Figure 9:
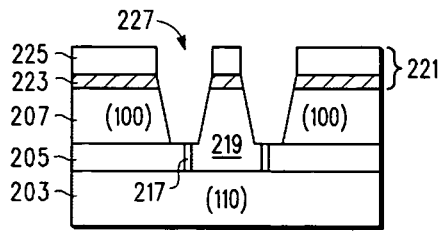
FIG. 9 is an illustration of a step of a process in accordance with the teachings herein.

Referring now to FIG. 8, a second hard mask 221 comprising an oxide layer 223 and a nitride layer 225 is formed over the structure. The second hard mask 221 is then patterned to define the field effect transistors (FETs). The exposed underlying portion of the SOI silicon 207 and the sidewall spacers 217 are then removed by etching to define trenches 227 therein which extend to the BOX 205 as shown in FIG. 9.

Figure 10:
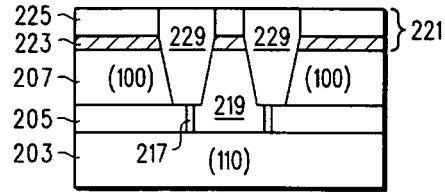
FIG. 10 is an illustration of a step of a process in accordance with the teachings herein.
Figure 11:
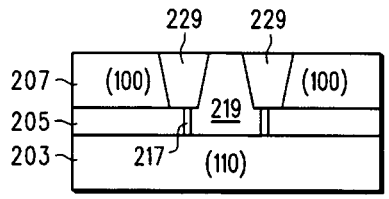
FIG. 11 is an illustration of a step of a process in accordance with the teachings herein.

The trenches 227 are then filled with a suitable oxide 229, as shown in FIG. 10, followed by CMP so that the oxide 229 is coplanar with the second hard mask 221. The second hard mask 221 is then stripped, and the exposed portion of the oxide 229 is etched back to the surface of the SOI silicon layer 207 as shown in FIG. 11. Various suitable wet and/or dry etches may be used for this purpose.

It will be appreciated that various modifications may be made to the foregoing process without departing from the scope of the teachings herein. For example, the first 209 and second 221 hard masks may have various constructions and chemical compositions, and are not limited to the oxide/nitride masks depicted in the foregoing processes. In some embodiments, a suitable photo resist may be used in place of these hard masks. Moreover, the device may contain additional, or fewer, layers than those shown.

It will also be appreciated that the SOI silicon layer 207 may be replaced in the foregoing process with germanium (Ge) or with silicon germanium (SiGe) alloys. Moreover, while it is preferred that the SOI silicon layer 207 has a (100) crystal orientation and that the substrate 203 has a (110) crystal orientation, the methodologies disclosed herein are not limited to any particular crystal orientation of either of these layers.

Figure 12:
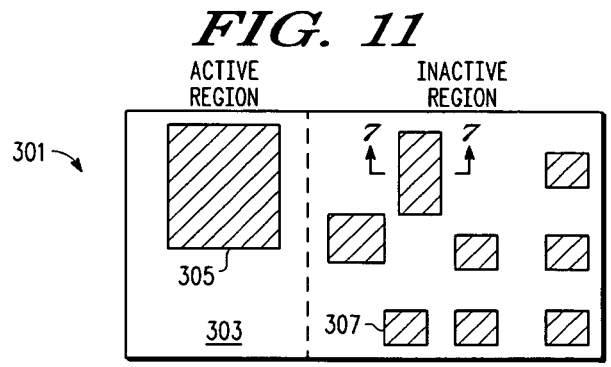
FIG. 12 depicts a top view of a semiconductor structure as it appears at the point in the process depicted in FIG. 7.
Figure 13:
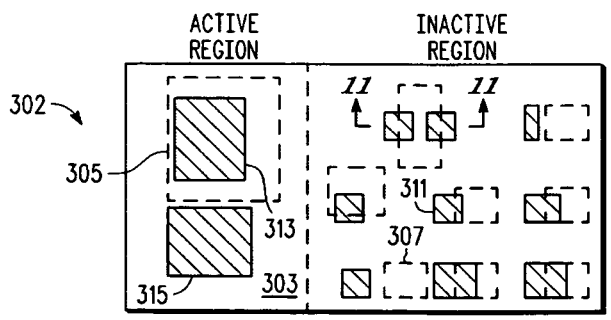
FIG. 13 depicts a top view of the semiconductor structure of FIG. 12 as it appears at the point in the process depicted in FIG. 11.

FIGS. 12-13 illustrate a particular, non-limiting embodiment of a tiling strategy in accordance with the teachings herein which may be implemented within the context of an "epitaxial first" process (that is, a process in which epitaxy precedes trench CMP) of the type depicted in FIGS. 1-11. FIG. 12 depicts a top view of a semiconductor structure 301 as it appears at the point in the process depicted in FIG. 7 (that is, after epitaxial CMP has been completed, the hard mask has been removed, and the epitaxial layer has been etched back to planarity with the SOI surface). In particular, FIG. 7 is a cross-sectional view taken along 7-7 of FIG. 12.

As seen in FIG. 12, the structure depicted therein has an SOI surface 303 upon which are disposed an active device 305 (such as, for example, a PFET) which is grown from the substrate, and a plurality of bulk epitaxial tiles 307. Notably, the epitaxial tiles 307 may be placed anywhere on the surface of the structure 301 where an active device (such as active device 305) is not positioned. In the particular embodiment depicted, the epitaxial tiles 307 are of various dimensions, and are placed in the inactive region of the device.

FIG. 13 depicts a top view of the semiconductor structure of FIG. 12 as it appears at the point in the process depicted in FIG. 11 (that is, after trench CMP has been completed, the second hard mask has been removed, and the epitaxial layer has been etched back to planarity with the SOI surface). In particular, FIG. 11 is a cross-sectional view taken along 11-11 of FIG. 13.

As seen in FIG. 13, the structure 302 has an SOI surface 303 upon which are disposed a plurality of silicon STI CMP tiles 311, and a plurality of active devices 313, 315. In the particular embodiment depicted, active device 313 connects to the substrate by way of the device 305, while active device 315 connects only to the SOI layer. Notably, the STI CMP tiles 311 may be placed anywhere on the surface of the structure 301 where active devices, such as active devices 313, 315, are not positioned.

In the particular embodiment depicted, the STI CMP tiles 311 are of various dimensions, and are placed in the inactive region of the device. The original outlines of the epitaxial tiles 307 (shown with dashed lines to distinguish them from the STI CMP tiles 311) are also depicted for comparison. Notably, some of the STI CMP tiles 311 overlap one or more epitaxial tiles 307, while other STI CMP tiles 311 do not overlap any epitaxial tiles 307. This thus underscores the design flexibility provided by the methodology described herein, namely, that the STI CMP tiles 311 may be optimized for STI CMP, and the epitaxial tiles 307 may be separately optimized for epitaxy. In a given implementation, the interaction between the two sets of tiles may be determined by design rule requirements.

Figure 14:
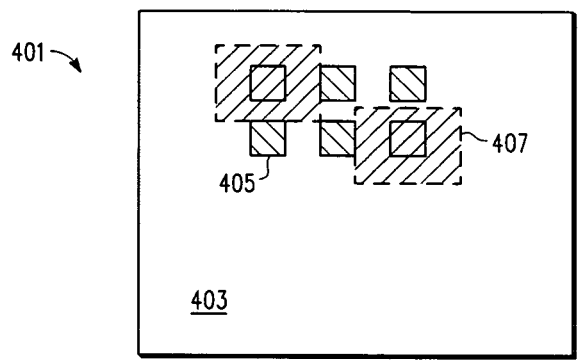
FIG. 14 illustrates the merging of tiles which can occur during epitaxy.

In designing a tiling scheme for epitaxial growth on a (110) bulk surface, lateral overgrowth is observed to happen at a faster rate than vertical growth. Moreover, the rate of overgrowth varies with direction, such that growth is preferred along certain crystallographic orientations. This phenomenon is depicted in FIG. 14. The structure 401 depicted therein comprises an SOI surface 403 upon which are disposed a plurality of STI CMP tiles 405 and a plurality of bulk epitaxial tiles 407. The dashed lines indicate the perimeter of the epitaxial tiles 407 after epitaxy. Depending on their proximity, it is thus possible for two epitaxial tiles 407 to merge during epitaxy, which can cause problems for the subsequent CMP.

Figure 15:
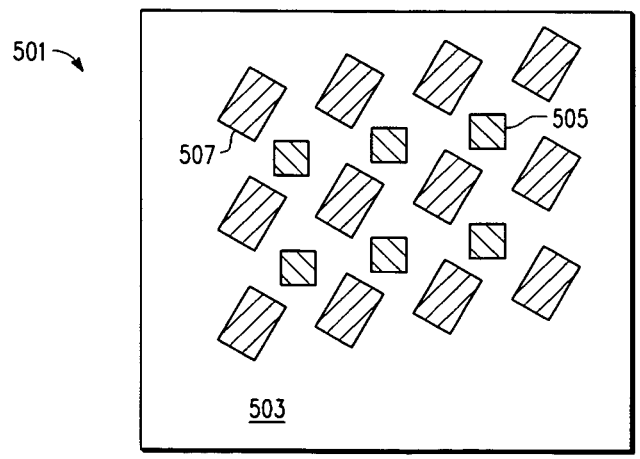
FIG. 15 illustrates a tiling strategy in which non-epitaxial tiles have been placed between epitaxial tiles to allow more room for overgrowth, and in which the orientation of the epitaxial tiles has been adjusted to effectively increase the distance between the epitaxial tiles in the direction of fastest growth.

One possible solution to this problem is illustrated in FIG. 15. The structure 501 depicted therein comprises an SOI surface 503 upon which are disposed a plurality of STI CMP tiles 505 and a plurality of bulk epitaxial tiles 507. However, in this embodiment, non-epitaxial tiles (in particular, the STI CMP tiles 505) have been placed between the epitaxial tiles 507, thereby allowing more room for overgrowth. Moreover, the orientation of the epitaxial tiles 507 has been adjusted to effectively increase the distance between the epitaxial tiles 507 in the direction of fastest growth. It will thus be appreciated that, by adjusting the orientation of the epitaxial tiles, the amount of silicon overburden may be tuned. Moreover, overgrowth issues and their impact on silicon CMP may be controlled by designing preferential facets into the overburden, as by orienting the epitaxial tiles along specific crystallographic orientations.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method of making a semiconductor device, the method comprising:
   obtaining a semiconductor structure comprising (a) a first semiconductor layer having a first crystallographic orientation, (b) a second semiconductor layer having a second crystallographic orientation distinct from said first crystallographic orientation wherein the second semiconductor layer includes an active region and an inactive region, and (c) an electrically insulating layer disposed between said first semiconductor layer and said second semiconductor layer;
   forming epitaxy features including a set of epitaxy active features in the active region of the second semiconductor layer and a set of epitaxy dummy features in the inactive region of the second semiconductor layer and, wherein said forming includes:
       patterning a first mask overlying the second semiconductor layer to define a set of openings corresponding to the set of epitaxy dummy features;
       removing portions of the second semiconductor layer and the electrically insulating layer underlying the set of openings in the first mask to form a first plurality of trenches extending through said second semiconductor layer and said insulating layer to expose portions of said first semiconductor layer; and
       forming a sidewall dielectric layer on sidewalls of said first plurality of trenches;
   epitaxially growing the epitaxy features from said exposed portions of said first semiconductor layer, wherein each of the epitaxial features:
       extends from the first silicon layer through the buried dielectric layer and the second silicon layer; and
       is insulated from the second silicon layer by the sidewall dielectric layer;
   performing a first chemical mechanical polish;
   forming isolation features including a set of isolation dummy features in the inactive region and a set of isolation trench features in the active region, wherein said forming includes:
       patterning a second mask overlying the second semiconductor layer to define a second set of openings;
       removing portions of the second semiconductor layer underlying the second set of openings to form a second plurality of trenches extending through said second semiconductor layer and terminating at the electrically insulating layer; and
       forming an isolation dielectric material in the second plurality of trenches to form the isolation features; and
   performing a second chemical mechanical polish.

2. The method of claim 1, wherein forming the isolation dielectric material in the second plurality of trenches defines a plurality of trench isolation structures.

3. The method of claim 1, wherein forming the isolation dielectric material in the second plurality of trenches includes filling the second plurality of trenches.

4. The method of claim 1, wherein forming the epitaxy features includes:
   forming the first mask overlying the semiconductor structure, said first mask comprising a hard mask.

5. The method of claim 1, wherein the semiconductor structure includes an active region and an inactive region and wherein the set of epitaxy dummy features and the set of isolation dummy features are located in the inactive region.

6. The method of claim 1, wherein forming the isolation features includes:
   forming a second mask over the second semiconductor layer, said second mask comprising a hard mask having a plurality of openings defined therein; and
   etching a portion of the semiconductor structure exposed by the second hard mask.

7. The method of claim 1, wherein the first mask is used to create the first plurality of trenches, and wherein the second mask is used to create the second plurality of trenches.

8. The method of claim 1, wherein the first semiconductor layer, the second semiconductor layer, and the epitaxy features comprise silicon.

9. The method of claim 8, wherein the first semiconductor layer has a (110) orientation.

10. The method of claim 9, wherein the second semiconductor layer has a (100) orientation.

11. The method of claim 1, wherein the second plurality of trenches include trench isolation structures in the active region of the second semiconductor layer.

12. The method of claim 11, wherein forming the isolation features occurs after forming the epitaxy features.

13. The method of claim 5, wherein a feature density of the epitaxy dummy features is determined independent of a feature density of the isolation dummy features.

14. The method of claim 1, wherein an isolation dummy feature is located between any pair of the epitaxy dummy features.

15. The method of claim 1, wherein portions of at least some of the isolation dummy features overlap portions of at least some of the epitaxy dummy features.

16. The method of claim 1 wherein the epitaxy dummy features are oriented along a first major axis, wherein the isolation dummy features are oriented along a second major axis, and wherein the first and second major axes are not parallel and not orthogonal.

17. The method of claim 16, wherein each of the epitaxy dummy features is substantially rectangular in shape, and wherein a longitudinal axis of each member of the isolation dummy features is oriented essentially parallel to the first major axis.

18. A semiconductor fabrication method, comprising:
forming, in a semiconductor structure comprising a second silicon layer overlying a buried dielectric layer overlying a first silicon layer, epitaxial features including active epitaxial features in an active region of a semiconductor device and epitaxial dummy features in an inactive region of the semiconductor device; and
thereafter forming dielectric features including trench isolation features in the active region of the semiconductor device and dummy isolation features in the inactive region;
wherein each of the epitaxial features:
extends from the first silicon layer through the buried dielectric layer and the second silicon layer; and
is insulated from the second silicon layer by a sidewall dielectric.

19. The method of claim 18, wherein:
a feature density of the epitaxial dummy features is determined independently of a feature density of the dummy isolation features.

* * * * *